(12) United States Patent
Niu et al.

(10) Patent No.: US 10,564,466 B2
(45) Date of Patent: Feb. 18, 2020

(54) DISPLAY PANEL ASSEMBLY, DISPLAY DEVICE AND DRIVING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaochen Niu, Beijing (CN); Xue Dong, Beijing (CN); Xiaochuan Chen, Beijing (CN); Wenqing Zhao, Beijing (CN); Ming Yang, Beijing (CN); Qian Wang, Beijing (CN); Pengcheng Lu, Beijing (CN); Jian Gao, Beijing (CN); Lei Wang, Beijing (CN); Rui Xu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 186 days.

(21) Appl. No.: 15/568,429

(22) PCT Filed: Apr. 19, 2017

(86) PCT No.: PCT/CN2017/081043
§ 371 (c)(1),
(2) Date: Oct. 20, 2017

(87) PCT Pub. No.: WO2017/198027
PCT Pub. Date: Nov. 23, 2017

(65) Prior Publication Data
US 2018/0217438 A1  Aug. 2, 2018

(30) Foreign Application Priority Data
May 19, 2016 (CN) .......................... 2016 1 0334414

(51) Int. Cl.
G02F 1/1335 (2006.01)
G02F 1/1343 (2006.01)
(Continued)

(52) U.S. Cl.
CPC .... G02F 1/133512 (2013.01); G02F 1/13718 (2013.01); G02F 1/134309 (2013.01); H01L 27/1214 (2013.01)

(58) Field of Classification Search
None
See application file for complete search history.

(56) References Cited

U.S. PATENT DOCUMENTS 6,327,014 B1  12/2001  Mulatier et al.
2012/0188475 A1*  7/2012  Inoue ................... H04N 13/398
                                                349/36
(Continued)

FOREIGN PATENT DOCUMENTS

CN  101097306 A  1/2008
CN  101097308 A  1/2008
(Continued)

OTHER PUBLICATIONS

International search report dated Jul. 4, 2017 for corresponding international application No. PCT/CN2017/081043 with English translation attached.
(Continued)

Primary Examiner — Ryan Crockett
(74) Attorney, Agent, or Firm — Nath, Goldberg & Meyer; Joshua B. Goldberg; Daniel Bissing

(57) ABSTRACT

Provided is a display panel assembly, comprising a display panel and a plurality of optical micro-structures arranged at a light outgoing side of the display panel. The display panel comprises a plurality of pixel groups, each of the plurality of pixel groups comprising one pixel or a plurality of pixels
(Continued)

sequentially arranged. Each of the plurality of optical microstructures corresponds to a plurality of pixel groups sequentially arranged, for modulating light emitted from the corresponding pixel groups to different fields of view. A display device and a driving method thereof are also provided.

15 Claims, 2 Drawing Sheets

(51) Int. Cl.
  *G02F 1/137* (2006.01)
  *H01L 27/12* (2006.01)

(56) References Cited

U.S. PATENT DOCUMENTS

| | | | | |
|---|---|---|---|---|
| 2012/0293503 | A1* | 11/2012 | Miyazawa | G02B 27/2214 345/419 |
| 2013/0308067 | A1* | 11/2013 | Hashimoto | G02B 27/2214 349/15 |
| 2014/0104521 | A1* | 4/2014 | Nishimura | G02F 1/13306 349/33 |
| 2014/0104545 | A1* | 4/2014 | Miyazawa | G02F 1/133528 349/96 |
| 2015/0301400 | A1* | 10/2015 | Kimura | G02F 1/133512 349/43 |
| 2016/0004128 | A1* | 1/2016 | Wu | G02B 27/2214 349/144 |
| 2016/0026026 | A1* | 1/2016 | Kim | G02F 1/13737 349/88 |

FOREIGN PATENT DOCUMENTS

| | | |
|---|---|---|
| CN | 101211032 A | 7/2008 |
| CN | 202110356 U | 1/2012 |
| CN | 102809865 A | 12/2012 |
| CN | 105425480 A | 3/2016 |
| CN | 105759528 A | 7/2016 |

OTHER PUBLICATIONS

Chinese office action dated Jul. 4, 2018 for corresponding application No. 201610334414.7 with English translation attached.

* cited by examiner

DISPLAY PANEL ASSEMBLY, DISPLAY DEVICE AND DRIVING METHOD THEREOF

This is a National Phase Application filed under 35 U.S.C. 371 as a national stage of PCT/CN2017/081043, filed Apr. 19, 2017, an application claiming the benefit of Chinese Application No. 201610334414.7, filed May 19, 2016, the content of each of which is hereby incorporated by reference in its entirety.

FIELD OF THE INVENTION

The present invention relates to the field of display technology, and particularly relates to a display panel assembly, a display device and a driving method thereof.

BACKGROUND OF THE INVENTION

A dual view field display function of a display device has become a hot spot in the field of display technology. The expression "dual view field" means that at a same time, two or more kinds of content displayed by the display device can be seen when viewing at two different angles. For example, during traveling of a motor vehicle, a driver needs to view navigation and traffic status from an onboard display, while a front passenger may want to watch a movie or entertainment program. An installation of two onboard displays is not only very costly, but also not allowed by spatial conditions. Accordingly, dual view field display becomes an optimal solution.

In the case of an existing dual view field display device, viewers need to wear glasses to see different pictures displayed by the display device through different glasses. This implementation of the dual view field display is high in cost and also inconvenient.

SUMMARY OF THE INVENTION

The present disclosure provides a display panel assembly, a display device and a driving method thereof, to achieve dual view field display at a low cost.

According to one aspect of the disclosure, a display panel assembly includes a display panel comprising a plurality of pixel groups, each of the plurality of pixel groups comprising one pixel or a plurality of pixels sequentially arranged; and a plurality of optical micro-structures arranged at a light outgoing side of the display panel, each of the plurality of optical micro-structures corresponding to a plurality of pixel groups sequentially arranged, for modulating light emitted from the corresponding pixel groups to different fields of view.

According to an embodiment of the present disclosure, the optical micro-structure may include a first electrode, a second electrode, and a liquid crystal layer located between the first electrode and the second electrode. The first electrode may include a plurality of first sub-electrodes insulated and spaced apart from each other, and each of the plurality of first sub-electrodes corresponds to one pixel. An electric field generated between each of the first sub-electrodes and the second electrode controls liquid crystal molecules in the liquid crystal layer at corresponding position of the first sub-electrode to deflect.

According to an embodiment of the present disclosure, the liquid crystal layer may include nematic liquid crystals.

According to an embodiment of the present disclosure, a light shielding member may be arranged between adjacent pixel groups corresponding to a same optical micro-structure.

According to an embodiment of the present disclosure, the first electrode may further include an intermediate sub-electrode corresponding to a position of the light shielding member, and the liquid crystal layer may further include cholesteric liquid crystals. The nematic liquid crystals may be located in areas corresponding to the first sub-electrodes, the cholesteric liquid crystals may be located in an area corresponding to the intermediate sub-electrode, and an electric field generated between the intermediate sub-electrode and the second electrode controls the cholesteric liquid crystals to be switched between a focal conic texture state and a planar texture state.

According to an embodiment of the present disclosure, each of the plurality of optical micro-structures may correspond to two sequentially arranged pixel groups.

According to another aspect of the present disclosure, a display device includes the display panel assembly according to the present disclosure.

According to another aspect of the present disclosure, a method of driving the display device according to the present disclosure is provided. The method includes providing drive signals to each of the plurality of optical micro-structures during a multiple view field display, so that each of the optical micro-structures modulates light emitted from the plurality of pixel groups sequentially arranged and corresponding to the optical micro-structure to different fields of view, wherein the number of fields of view is same as the number of pixel groups corresponding to the optical micro-structure.

According to an embodiment of the present disclosure, the optical micro-structure may include a first electrode, a second electrode, and a liquid crystal layer located between the first electrode and the second electrode, and the first electrode may include a plurality of first sub-electrodes insulated and spaced apart from each other. During the multiple view field display, the step of providing drive signals to the optical micro-structure may include providing a first voltage signal to the second electrode; and providing a second voltage signal to the first sub-electrodes respectively, so that the liquid crystal molecules at positions of different pixel groups deflect toward different directions.

According to an embodiment of the present disclosure, a light shielding member may be arranged between adjacent pixel groups corresponding to a same optical micro-structure, the first electrode may further include an intermediate sub-electrode corresponding to a position of the light shielding member, and the liquid crystal layer may include cholesteric liquid crystals corresponding to a position of the intermediate sub-electrode. The method may further include when switching from the multiple view field display to a single view field display, providing a first pulse signal to the intermediate sub-electrode, so that the cholesteric liquid crystals come into a focal conic texture state; and when switching from the single view field display to the multiple view field display, providing a second pulse signal to the intermediate sub-electrode, so that the cholesteric liquid crystals come into a planar texture state.

In the display panel assembly, the display device and the driving method thereof according to the present disclosure, each optical micro-structure may correspond to a plurality of pixel groups, light from a first pixel group is emitted to a first field of view after passing through the optical micro-structure, and light from a second pixel group is emitted to a second field of view after passing through the optical micro-structure, and so on. Therefore, when displaying images, all of the first pixel groups may be controlled to jointly display a first image, all of the second pixel groups may be controlled to jointly display a second image, and so on, so that different displayed images can be seen in different fields of view, and thus a dual view field display or a multiple view field display can be achieved without wearing glasses, for reducing the cost.

BRIEF DESCRIPTION OF THE DRAWINGS

The accompanying drawings intended to provide further understanding of the present invention form a part of the specification, and are used for illustrating rather than limiting the present invention. In the drawings.

DETAILED DESCRIPTION OF THE EMBODIMENTS

Specific embodiments of the present invention are described in detail below in conjunction with the accompanying drawings. It should be understood that the specific embodiments described here are only used for illustrating and explaining the present invention, instead of limiting the present invention.

Figure 1:
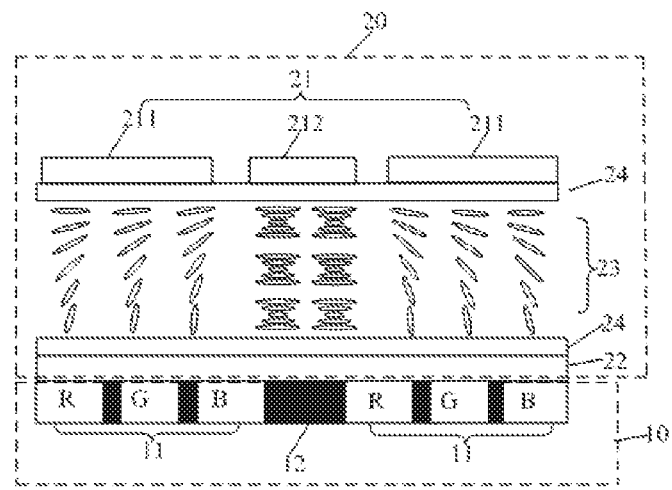
FIG. 1 is a partial diagram showing the structure of a display panel assembly according to an embodiment of the present disclosure.
Figure 2:
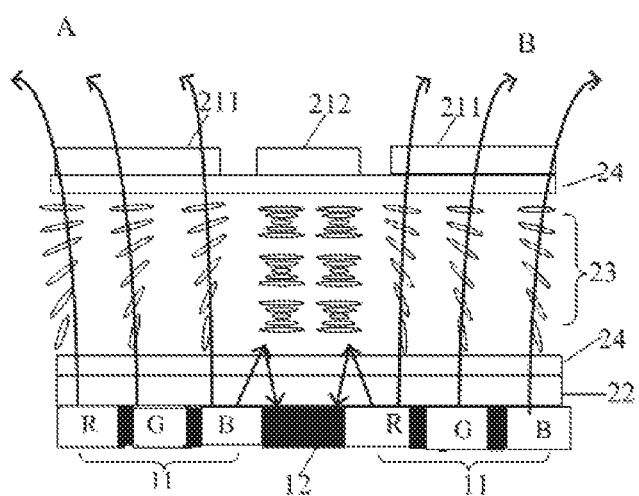
FIG. 2 schematically shows a state of the display panel assembly in FIG. 1 during dual view field display.

FIG. 1 is a partial diagram showing the structure of a display panel assembly according to an embodiment of the present disclosure, and FIG. 2 schematically shows a state of the display panel assembly in FIG. 1 during dual view field display.

As shown in FIGS. 1 and 2, the display panel assembly according to the embodiment of the present disclosure may include a display panel 10 and a plurality of optical micro-structures 20 arranged at a light outgoing side of the display panel 10. The display panel 10 may include a plurality of pixel groups, and each pixel group may include one pixel 11 or a plurality of pixels 11 sequentially arranged. Each optical micro-structure 20 may correspond to a plurality of pixel groups sequentially arranged, for modulating light emitted from corresponding different pixel groups to different fields of view.

Figure 3:
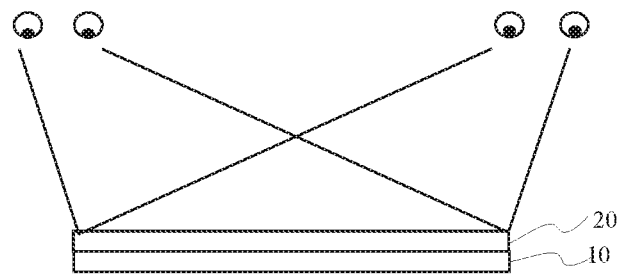
FIG. 3 schematically illustrates dual fields of view formed by the display panel assembly according to the embodiment of the present disclosure shown in FIG. 1.

It can be understood that the number of fields of view is same as the number of pixel groups corresponding to one optical micro-structure 20. Therefore, the more fields of view the same display panel assembly generates (i.e. a larger number of pixel groups corresponding to one optical micro-structure 20), the lower image definition is, and the closer distances between different fields of view are, which is liable to cause interference. To ensure display effect, according to the embodiment of the present disclosure, as shown in FIG. 1, each optical micro-structure 20 may correspond to two sequentially arranged pixel groups, for modulating light emitted from the two pixel groups corresponding to the optical micro-structure 20 to two different fields of view, to achieve dual view field display. FIG. 3 schematically illustrates dual fields of view formed by the display panel assembly according to the embodiment of the present disclosure shown in FIG. 1.

The pixel 11 is a structure capable of displaying expected colors completely. For example, the pixel 11 may include sub-pixels of three or four different colors. R, G and B shown in FIG. 1 represent three sub-pixels, red, green and blue, included in the pixel 11, respectively. In the context of the present disclosure, the "field of view" means an area where displayed content can be viewed independently. When the display panel displays an image, the image displayed by the display panel can be seen at the field of view. The "number of fields of view" means a total number of areas capable of receiving light emitted from the display panel, i.e. a total number of areas where the image displayed by the display panel can be seen.

Multiple view field display can be achieved by using the display panel assembly according to the embodiment of the present disclosure. In a plurality of pixel groups corresponding to each optical micro-structure 20, light from a first pixel group is radiated to a first field of view after passing through the optical micro-structure 20, light from a second pixel group is radiated to a second field of view after passing through the optical micro-structure 20, and so on. Therefore, in displaying images, all first pixel groups may be controlled to jointly display a first image, all second pixel groups may be controlled to jointly display a second image, and so on, so that different images are seen in different fields of view, and thus dual view field display or multiple view field display can be achieved without wearing glasses, thereby reducing the cost.

It should be appreciated that the inclined angles between emitting light, modulated by the optical micro-structure, corresponding to a plurality of pixel groups for a same field of view and a display surface of the display panel 10 may be not necessarily same. For example, in the case each optical micro-structure 20 corresponds to two pixel groups (a first pixel group and a second pixel group), the directions of modulated light emitted from the first pixel group located in the middle of the display panel may be different from the directions of modulated light emitted from the first pixel group located at an edge of the display panel, such that a viewer in the first field of view can receive light emitted from all of the first pixel groups at various positions of the display panel. In addition, in the case each pixel group includes a plurality of pixels 11, the directions of modulated light emitted from different pixels in a same pixel group may also be different.

As shown in FIG. 1, the optical micro-structure 20 may include a first electrode 21, a second electrode 22, and a liquid crystal layer 23 located between the first electrode 21 and the second electrode 22. The first electrode 21 may include a plurality of first sub-electrodes 211 that are insulated and spaced apart from each other, and each first sub-electrode 211 may correspond to one pixel 11 in a pixel group. Electric fields generated between the first sub-electrodes 211 and the second electrode 22 can control liquid crystal molecules in the liquid crystal layer 23 at corresponding positions to deflect. Therefore, electric signals may be applied to the first sub-electrodes 211 and the second electrode 22, respectively, so that the liquid crystal molecules in the liquid crystal layer 23 corresponding to the pixels 11 in different pixel groups deflect toward different directions respectively.

Figure 4:
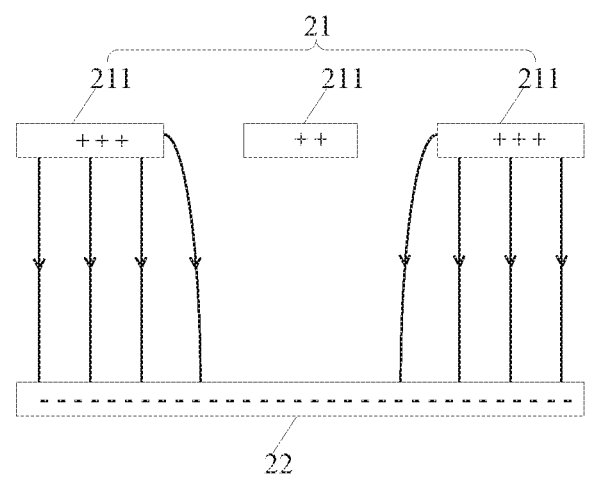
FIG. 4 schematically illustrates electric field distribution between a first electrode and a second electrode of an optical micro-structure in the display panel assembly according to the embodiment of the present disclosure shown in FIG. 1.

FIG. 4 schematically illustrates electric field distribution between the first electrode and the second electrode of the optical micro-structure in the display panel assembly according to the embodiment of the present disclosure shown in FIG. 1.

Referring to FIGS. 1, 2 and 4, in the exemplary embodiment shown in FIG. 1, each optical micro-structure 20 may correspond to two pixel groups, and each pixel group may include one pixel 11. The first electrode 21 includes two first sub-electrodes 211 corresponding to two pixels 11. When different electric signals are applied to the first sub-electrodes 211 and the second electrode 22, respectively, due to a gap between the two adjacent first sub-electrodes 211, parallel electric fields and fringing electric fields are generated between the two first sub-electrodes 211 and the second electrode 22, as shown in FIG. 4. Therefore, the liquid crystal molecules in the liquid crystal layer 23 corresponding to different first sub-electrodes 211 deflect at different angles, eventually resulting in that the directions of the light emitted from different pixels 11 change differently, as shown in FIG. 2. The electric fields between the two first sub-electrodes 211 and the second electrode 22 are distributed symmetrically, and deflection directions of the liquid crystal molecules corresponding to the two first sub-electrodes 211 respectively are different. In FIG. 2, the light emitted from the left pixel 11 is radiated in a left-inclined direction after passing through the liquid crystal molecules, and the light emitted from the right pixel 11 is radiated in a right-inclined direction after passing through the liquid crystal molecules. Alternatively, the voltages between two first sub-electrodes 211 and the second electrode 22 may also be adjusted so that the light emitted from the left pixel 11 is radiated in a right-inclined direction after passing through the liquid crystal molecules, and the light emitted from the right pixel 11 is radiated in a left-inclined direction after passing through the liquid crystal molecules.

As shown in FIG. 1, each pixel group may include only one pixel 11, and thus in the image seen in any field of view, the pixels 11 for displaying the image are distributed uniformly, to improve display effect. However, the embodiments of the present invention are not limited thereto. Each pixel group may include a plurality of pixels 11 sequentially arranged, and the optical micro-structure 20 corresponding to the pixel group may include a plurality of first sub-electrodes 211 corresponding to the pixels in the pixel group.

According to the embodiment of the present disclosure, the intensity of the electric fields between the first sub-electrodes 211 and the second electrode 22 can be controlled to change deflection angles of the liquid crystal molecules so as to change angles of the emitting light, and by adjusting the intensity of the electric fields between the first sub-electrodes 211 and the second electrode 22, deflection angles of the light can be large enough to prevent interference between two or more fields of view generated.

According to the embodiment of the present disclosure, the first electrodes 21 of the plurality of optical micro-structures 20 arranged at the light outgoing side of the display panel 10 may be located in a same layer, the second electrodes 22 of the plurality of optical micro-structures 20 may be located in a same layer, and the liquid crystal layers 23 of the plurality of optical micro-structures 20 may be located in a same layer. In addition, the second electrodes 22 of the plurality of optical micro-structures 20 may be connected to each other to form a plate electrode, and all the first sub-electrodes 211 corresponding to the pixels 11 may be formed as block electrodes or may include a plurality of strip electrodes that are spaced apart from each other.

Furthermore, the first electrode 21 and the second electrode 22 may be made of a transparent metal material (such as indium tin oxide).

According to the embodiment of the present disclosure, the liquid crystal layer 23 may include nematic liquid crystals. The nematic liquid crystals may be distributed in the entire area between the first electrode 21 and the second electrode 22. Alternatively, the nematic liquid crystals may be arranged only at positions corresponding to the first sub-electrodes 211. In a same optical micro-structure 20, initial orientations (i.e. pretilt angles) of the nematic liquid crystals corresponding to different first sub-electrodes 211 may be different from each other, so that the liquid crystal molecules corresponding to different first sub-electrodes 211 deflect toward different directions in a same electric field. According to the embodiment of the present disclosure, orientation layers 24 may be arranged between the first electrode 21 and the liquid crystal layer 23 and between the second electrode 22 and the liquid crystal layer 23 respectively, to allow the nematic liquid crystals to reach preset pretilt angles.

According to the embodiment of the present disclosure, a light shielding member 12 may be arranged between adjacent pixel groups of the display panel 10, as shown in FIG. 1. In addition, the optical micro-structure 20 may also include a part corresponding to the light shielding member 12.

Figure 5:
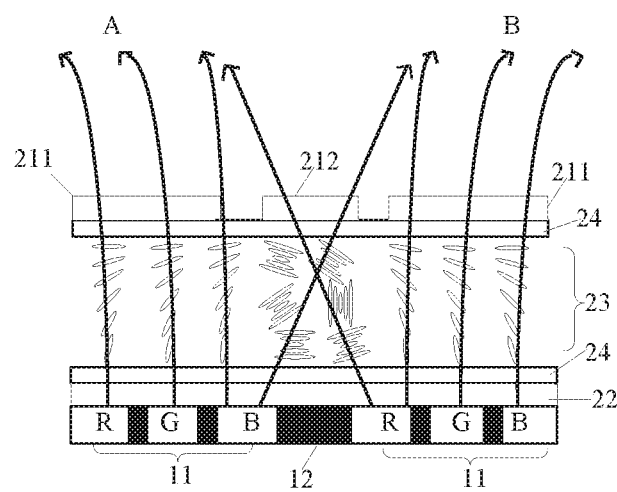
FIG. 5 schematically shows a state of the display panel assembly in FIG. 1 during ordinary display.

FIG. 5 schematically shows a state of the display panel assembly in FIG. 1 during ordinary display.

Referring to FIGS. 2 and 5, the part of the optical micro-structure 20 corresponding to the light shielding member 12 can switch between a light transmissive state and a light shielding state. As shown in FIG. 2, when the part of the optical micro-structure 20 corresponding to the light shielding member 12 is in the light shielding state, light emitted from the left pixel 11 is radiated to a field of view A, and light emitted from the right pixel 11 is radiated to a field of view B; and light from the display panel assembly is not present between the field of view A and the field of view B. Therefore, dual fields of view can be formed for the entire display panel assembly, and no image can be seen in an area between the two fields of view, as shown in FIG. 3. As shown in FIG. 5, when the part of the optical micro-structure 20 corresponding to the light shielding member 12 is in the light transmissive state, a part of light emitted from the left pixel 11 is radiated to the field of view A after passing through the nematic liquid crystals corresponding to the first sub-electrodes 211, and the other part of the light is radiated to a position (e.g. field of view B) outside the field of view A after passing through the liquid crystals corresponding to the light shielding member 12. Furthermore, a part of light emitted from the right pixel 11 is radiated to the field of view B after passing through the nematic liquid crystals corresponding to the first sub-electrodes 211, and the other part of the light is radiated to a position (e.g. field of view A) outside the field of view B after passing through the liquid crystals corresponding to the light shielding member 12. Therefore, light from all pixels can be seen at any position, to achieve ordinary display. According to the embodiment, switching between dual view field (or multiple view field) display and ordinary display can be achieved by changing the state of the part of the optical micro-structure 20 corresponding to the light shielding member 12.

Switching between the two states (i.e. the light transmissive state and the light shielding state) of the part of the optical micro-structure 20 corresponding to the light shielding member 12 can be achieved by adopting different structures. According to the embodiment of the present disclosure, a position of the liquid crystal layer 23 corresponding to the light shielding member 12 is provided with nematic liquid crystals (the nematic liquid crystals may be distributed in the entire area between the first electrode 21 and the second electrode 22). In this case, the nematic liquid crystals can be controlled by applying an electric field to the part of the optical micro-structure 20 corresponding to the light shielding member 12, to achieve the light transmissive state and the light shielding state.

According to the embodiment of the present disclosure, as shown in FIG. 1, the first electrode 21 may further include an intermediate sub-electrode 212 corresponding to the position of the light shielding member 12. In addition, the liquid crystal layer 23 may further include cholesteric liquid crystals corresponding to the position of the intermediate sub-electrode 212; that is, the cholesteric liquid crystals may be located between the intermediate sub-electrode 212 and the second electrode 22, so an electric field generated between the intermediate sub-electrode 212 and the second electrode 22 can control the cholesteric liquid crystals to switch between a focal conic texture state and a planar texture state, so that the part of the optical micro-structure 20 corresponding to the light shielding member 12 switches between the light transmissive state and the light shielding state.

As shown in FIG. 2, when the cholesteric liquid crystals are in the planar texture state, light can be shielded to achieve dual view field (or multiple view field) display; and as shown in FIG. 5, when the cholesteric liquid crystals are in the focal conic texture state, light from the pixels 11 can be radiated to multiple directions after passing through the cholesteric liquid crystals to achieve single view field (ordinary) display. In addition, the cholesteric liquid crystals in the focal conic texture state can radiate light uniformly toward various directions, so that the emitting light is distributed more uniformly during single view field display.

To switch between single view field display and dual view field (or multiple view field) display, it only needs to provide a pulse signal to the intermediate sub-electrode 212 so that the cholesteric liquid crystals switch between the focal conic texture state and the planar texture state. After switching is completed, the cholesteric liquid crystals are maintained stable to ensure stability.

According to the embodiment of the present disclosure, the display panel 10 may be a liquid crystal display panel. Alternatively, the display panel 10 may be an organic electroluminescent display panel. The pixel 11 may include a plurality of sub-pixels of different colors. In the same pixel 11, a light shielding member may be arranged between adjacent sub-pixels to shield a signal line on an array substrate of the display panel 10. The plurality of light shielding members between the sub-pixels can form a grid-like black matrix.

When the optical micro-structure 20 has the structure shown in FIG. 1, the width of the light shielding member 12 between the pixels 11 may be different from the width of the light shielding member between adjacent sub-pixels of the same pixel 11. The width of the light shielding member 12 between the pixels 11 may be determined according to the size of the pixels 11, the resolution of the display panel 10, the number of cholesteric liquid crystals, among other factors.

According to another aspect of the present disclosure, a display device is provided, which includes the display panel assembly according to the present disclosure. When the display panel is a liquid crystal display panel, the display device according to the present disclosure may further include a backlight source, among other structures.

The display device according to the present disclosure may further include a drive circuit for providing drive signals to the display panel assembly to enable the display panel to display an image. The drive circuit may provide drive signals to the first sub-electrodes 211 of the first electrode 21, the intermediate sub-electrode 212 of the first electrode 21, and the second electrode 22 respectively, so that the display panel assembly according to the present disclosure included in the display device performs single view field or dual view field (or multiple view field) display as desired.

According to another aspect of the present disclosure, a driving method of a display device is provided, including: providing drive signals to each optical micro-structure 20 during multiple view field display, so that the optical micro-structure 20 modulates light emitted from a plurality of pixel groups sequentially arranged and corresponding to the optical micro-structure 20, to different fields of view, wherein the number of fields of view is same as the number of pixel groups corresponding to one optical micro-structure 20.

According to the embodiment of the present disclosure, during multiple view field display, drive signals for a plurality of images to be displayed are provided to the display panel 10 during each display period. The number of images to be displayed is same as the number of pixel groups corresponding to one optical micro-structure 20. A complete image to be displayed can be displayed in a same field of view, and different images to be displayed can be displayed in different fields of view.

As described above, the optical micro-structure 20 may include a first electrode 21, a second electrode 22, and a liquid crystal layer 23 located between the first electrode 21 and the second electrode 22, and the first electrode 21 includes a plurality of first sub-electrodes 211 that are insulated and spaced apart from each other. In this case, during multiple view field display, the step of providing drive signals to the optical micro-structure 20 may include: providing a first voltage signal to the second electrode 22, and providing second voltage signals to the first sub-electrodes 211 respectively, so that the liquid crystal molecules at positions of different pixel groups deflect toward different directions.

The magnitudes of the second voltage signals applied to the first sub-electrodes 211 may be different from each other. Referring to FIG. 2, when the magnitudes of the second voltage signals applied to the two first sub-electrodes 211 are same, the directions of the light emitted from the two pixels 11 after being modulated by the optical micro-structure 20 may be symmetrical; and when the magnitudes of the second voltage signals applied to the two first sub-electrodes 211 are different, the directions of the light emitted from the two pixels 11 after being modulated by the optical micro-structure 20 may be unsymmetrical. Therefore, during multiple view field display, by reasonably adjusting the second voltage signals applied to the first sub-electrodes 211, the light emitted from each pixel 11 after being modulated by the optical micro-structure 20 can be radiated to a desired view field position.

As shown in FIG. 1, when the display panel includes a light shielding member 12 between adjacent pixel groups, the first electrode 21 further includes an intermediate sub-electrode 212 corresponding to the position of the light shielding member 12, and the liquid crystal layer 23 includes cholesteric liquid crystals corresponding to the position of the intermediate sub-electrode 212, the driving method may further include: when switching from multiple view field display to single view field display, providing a first pulse signal to the intermediate sub-electrode 212, so that the cholesteric liquid crystals come into a focal conic texture state; and when switching from single view field display to multiple view field display, providing a second pulse signal to the intermediate sub-electrode 212, so that the cholesteric liquid crystals come into a planar texture state.

It should be understood that the focal conic texture state and the planar texture state of the cholesteric liquid crystals are both stable states. Therefore, it only needs to provide a pulse signal to control the cholesteric liquid crystals to switch from the focal conic texture state to the planar texture state or from the planar texture state to the focal conic texture state, and after stabilization, no electric signal needs to be provided to maintain the state.

It should be understood that the above embodiments are only exemplary embodiments for illustrating the principle of the present invention; however, the present invention is not limited thereto. For those of one of ordinary skill in the art, various modifications and improvements can be made without departing from the spirit and essence of the present invention, and these modifications and improvements are also encompassed within the protection scope of the present invention.

The invention claimed is:

1. A display panel assembly, comprising:
a display panel comprising a plurality of pixel groups, each of the plurality of pixel groups comprising one pixel or a plurality of pixels sequentially arranged; and
a plurality of optical micro-structures arranged at a light outgoing side of the display panel, each of the plurality of optical micro-structures corresponding to a plurality of pixel groups sequentially arranged, for modulating light emitted from the corresponding pixel groups to different fields of view,
wherein each of the optical micro-structures comprises a first electrode, a second electrode, and a liquid crystal layer located between the first electrode and the second electrode, the first electrode comprises a plurality of first sub-electrodes insulated and spaced apart from each other, each of the plurality of first sub-electrodes corresponds to one pixel,
wherein an electric field generated between each of the first sub-electrodes and the second electrode controls liquid crystal molecules in the liquid crystal layer at corresponding position of the first sub-electrode to deflect,
wherein a light shielding member is arranged between adjacent pixel groups corresponding to a same optical micro-structure, and
wherein the first electrode further comprises an intermediate sub-electrode corresponding to a position of the light shielding member, and the liquid crystal layer further comprises cholesteric liquid crystals, and the cholesteric liquid crystals are located in an area corresponding to the intermediate sub-electrode, and an electric field venerated between the intermediate sub-electrode and the second electrode controls the cholesteric liquid crystals to be switched between a focal conic texture state and a planar texture state.

2. The display panel assembly of claim 1, wherein the liquid crystal layer comprises nematic liquid crystals.

3. The display panel assembly of claim 2, wherein the nematic liquid crystals are located in areas corresponding to the first sub-electrodes.

4. The display panel assembly of claim 3, wherein each of the plurality of optical micro-structures corresponds to two sequentially arranged pixel groups.

5. The display panel assembly of claim 2, wherein each of the plurality of optical micro-structures corresponds to two sequentially arranged pixel groups.

6. The display panel assembly of claim 2, wherein each of the plurality of optical micro-structures corresponds to two sequentially arranged pixel groups.

7. The display panel assembly of claim 1, wherein each of the plurality of optical micro-structures corresponds to two sequentially arranged pixel groups.

8. A display device comprising the display panel assembly of claim 1.

9. A method of driving the display device of claim 8, the method comprising:
providing drive signals to each of the plurality of optical micro-structures during a multiple view field display, so that each of the optical micro-structures modulates light emitted from the plurality of pixel groups sequentially arranged and corresponding to the optical micro-structure to different fields of view, wherein the number of fields of view is same as the number of pixel groups corresponding to the optical micro-structure,
wherein each of the plurality of optical micro-structures comprises a first electrode, a second electrode, and a liquid crystal layer located between the first electrode and the second electrode, and the first electrode comprises a plurality of first sub-electrodes insulated and spaced apart from each other,
during the multiple view field display, the step of providing driving signals to each of the plurality of the optical micro-structures comprising:
providing a first voltage signal to the second electrode; and
providing a second voltage signal to the first sub-electrodes respectively, so that the liquid crystal molecules at positions of different pixel groups deflect toward different directions;
wherein a light shielding member is arranged between adjacent pixel groups corresponding to a same optical micro-structure, the first electrode further comprises an intermediate sub-electrode corresponding to a position of the light shielding member, and the liquid crystal layer comprises cholesteric liquid crystals corresponding to a position of the intermediate sub-electrode,
the driving method further comprising:
when switching from the multiple view field display to a single view field display, providing a first pulse signal to the intermediate sub-electrode, so that the cholesteric liquid crystals come into a focal conic texture state; and
when switching from the single view field display to the multiple view field display, providing a second pulse signal to the intermediate sub-electrode, so that the cholesteric liquid crystals come into a planar texture state.

10. The display device of claim 8, wherein each of the optical micro-structures comprises a first electrode, a second electrode, and a liquid crystal layer located between the first electrode and the second electrode,
the first electrode comprises a plurality of first sub-electrodes insulated and spaced apart from each other, each of the plurality of first sub-electrodes corresponds to one pixel, wherein an electric field generated between each of the first sub-electrodes and the second electrode controls liquid crystal molecules in the liquid crystal layer at corresponding position of the first sub-electrode to deflect.

11. The display device of claim 10, wherein the liquid crystal layer comprises nematic liquid crystals.

12. The display device of claim 11, wherein a light shielding member is arranged between adjacent pixel groups corresponding to a same optical micro-structure.

13. The display device of claim 12, wherein the first electrode further comprises an intermediate sub-electrode corresponding to a position of the light shielding member, and the liquid crystal layer further comprises cholesteric liquid crystals, wherein the nematic liquid crystals are located in areas corresponding to the first sub-electrodes, and the cholesteric liquid crystals are located in an area corresponding to the intermediate sub-electrode, and an electric field generated between the intermediate sub-electrode and the second electrode controls the cholesteric liquid crystals to be switched between a focal conic texture state and a planar texture state.

14. The display device of claim 8, wherein each of the plurality of optical micro-structures corresponds to two sequentially arranged pixel groups.

15. The display panel assembly of claim 1, wherein each of the plurality of optical micro-structures corresponds to two sequentially arranged pixel groups.

* * * * *